United States Patent
Galli (10) Patent No.: US 6,552,584 B2
(45) Date of Patent: Apr. 22, 2003

(54) OUTPUT STAGE FOR HIGH-SPEED COMPARATOR CIRCUITS

(75) Inventor: Giovanni Galli, Galati Marina (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/826,776

(22) Filed: Apr. 30, 2001

(65) Prior Publication Data

US 2002/0008251 A1 Jan. 24, 2002

Related U.S. Application Data

(63) Continuation of application No. 09/668,022, filed on Sep. 21, 2000, now abandoned.

(30) Foreign Application Priority Data

Sep. 24, 1999 (IT) .......................... MI99A1990

(51) Int. Cl.[7] .............................. H03K 3/00; H03K 5/12
(52) U.S. Cl. ...................... 327/112; 327/170; 327/432
(58) Field of Search .................... 327/108, 111, 327/112, 170, 379, 380, 381, 384, 387, 389, 391, 427, 432; 326/26, 27, 57, 82, 83, 86, 87

(56) References Cited

U.S. PATENT DOCUMENTS

| | | | | |
|---|---|---|---|---|
| 4,477,741 A | * | 10/1984 | Moser, Jr. | 327/111 |
| 4,829,199 A | * | 5/1989 | Prater | 326/27 |
| 5,410,262 A | * | 4/1995 | Kang | 327/170 |

* cited by examiner

*Primary Examiner*—Toan Tran
(74) *Attorney, Agent, or Firm*—Lisa K. Jorgenson; Dennis M. de Guzman; Seed IP Law Group PLLC

(57) ABSTRACT

A final stage for a high-speed comparator, and a method of driving an electric load having a capacitive component are disclosed. The final stage comprises a first or pull-up component and a second or pull-down component which are connected in series with each other between a first or supply voltage reference and a second voltage reference. A dynamic drive device and a separate static drive device are coupled to each component of the output stage. Each component of the final stage is driven separately according to whether it is in a static or a dynamic load condition.

22 Claims, 7 Drawing Sheets

FIG. 15 ized for the largest shorting current therethrough,
OUTPUT STAGE FOR HIGH-SPEED COMPARATOR CIRCUITS This is a continuation of application Ser. No. 09/668,022, filed Sep. 21, 2000 abandoned.

TECHNICAL FIELD

The present invention broadly relates to an output stage for high-speed comparator circuits.

BACKGROUND OF THE INVENTION

Many integrated circuits incorporate a voltage regulator and a comparator for driving an electric load, for instance.

In particular, an output stage for such an integrated electronic circuit includes a driver circuit of an electric load having at least one capacitive component. The output stage comprises a first or pull-up component and a second or pull-down component which are connected in series with each other between a first or supply voltage reference and a second voltage reference.

As is well known, an integrated circuit for driving electric loads typically includes a regulator and a comparator for driving a power transistor, such as a power MOS, outside the integrated circuit. The comparator functions to set the operational threshold of the integrated driver circuit.

Essentially, the voltage regulator provides a regulated supply for the electric load, through the power transistor being enabled by the comparator. The output of the comparator is connected to the control terminal of the power transistor; the transistor is turned on as the main supply voltage rises above a threshold value which is set by the comparator.

The comparator is to drive the power transistor at a high speed, in order to prevent "glitches" from being generated during transition of the output control from the voltage regulator to the power transistor.

Figure 1:
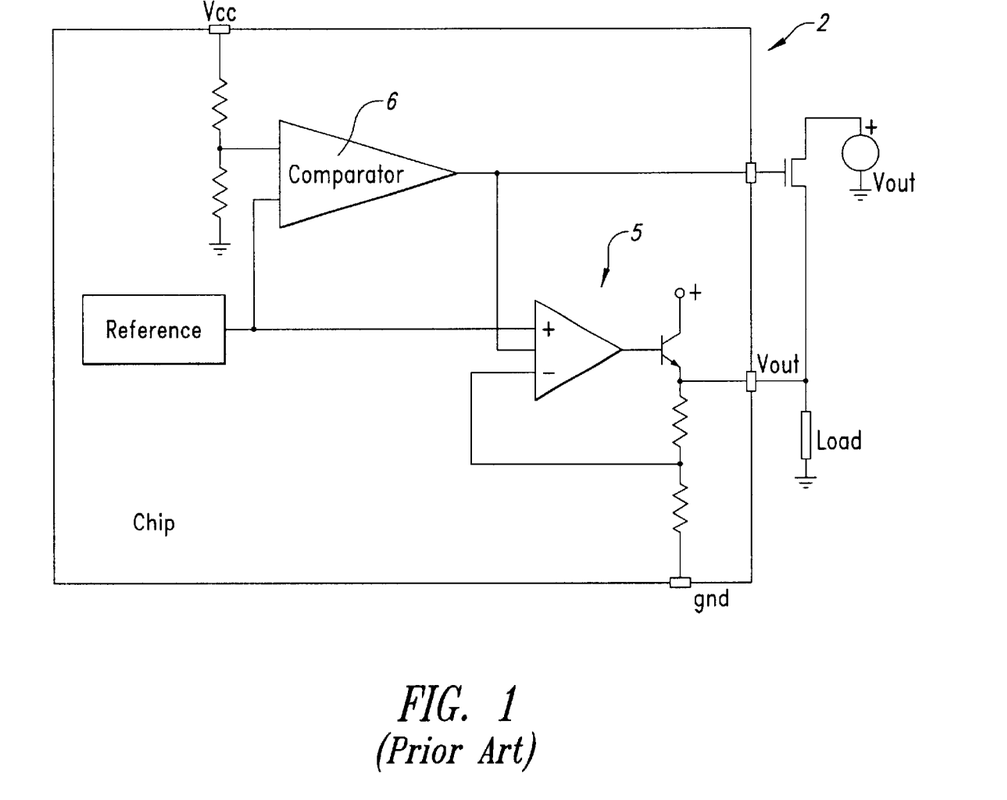
FIG. 1 shows schematically an integrated regulator/comparator circuit according to the prior art.

FIG. 1 of the accompanying drawings shows schematically an integrated regulator/comparator circuit 2 according to the prior art. The circuit 2 includes a voltage regulator 5 having an output coupled between a MOS power transistor and a load. The circuit 2 also includes a comparator 6 having a first input coupled to a voltage reference Vcc, a second input coupled to a reference voltage, and an output coupled to the voltage regulator 5 and a gate of the power transistor.

The overall speed of the circuit is mainly dependent on the speed of the comparator 6, and in particular, on the amount of delay introduced by the various stages of the comparator. However, the strength of the charge current to the inner capacitance Cg of the power transistor is also a factor in the final stage delay.

Furthermore, it should be considered that the power transistor is an external device, and that the connection terminal between the integrated driver circuit and the power transistor must be safeguarded against incidental shorting. This reflects unfavorably on the circuit construction of the output stages of comparators To provide a comparator with a final stage which can charge a capacitive load, such as the inherent capacitance of a power transistor, at a fast rate, the current used to drive the capacitance would have to be maximized.

Figure 2:
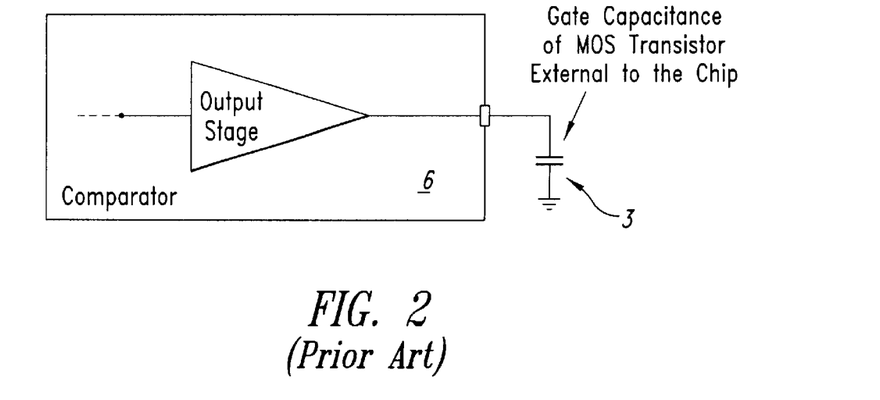
FIG. 2 shows schematically an output stage of a comparator connected to a capacitive load.

With reference to the diagram of FIG. 2, the voltage Vc across said capacitance is given as:

$$Vc = 1/C * \int i \, dt = (I*T)/C \quad (1)$$

from which the charge duration T is obtained, as follows.

$$T = Vc*(C/I) \quad (2)$$

However, while on the one side, the charge current should be maximized for reduced delay in driving the external electric load, on the other side, this current must be limited, to avoid destruction of the comparator final stage on the occurrence of incidental shorts to the voltage references, i e., ground GND and supply Vcc, of the output stage.

As said before, it is common practice to provide the final stages of comparators with protective circuit portions that protect against shorting.

Figure 3:
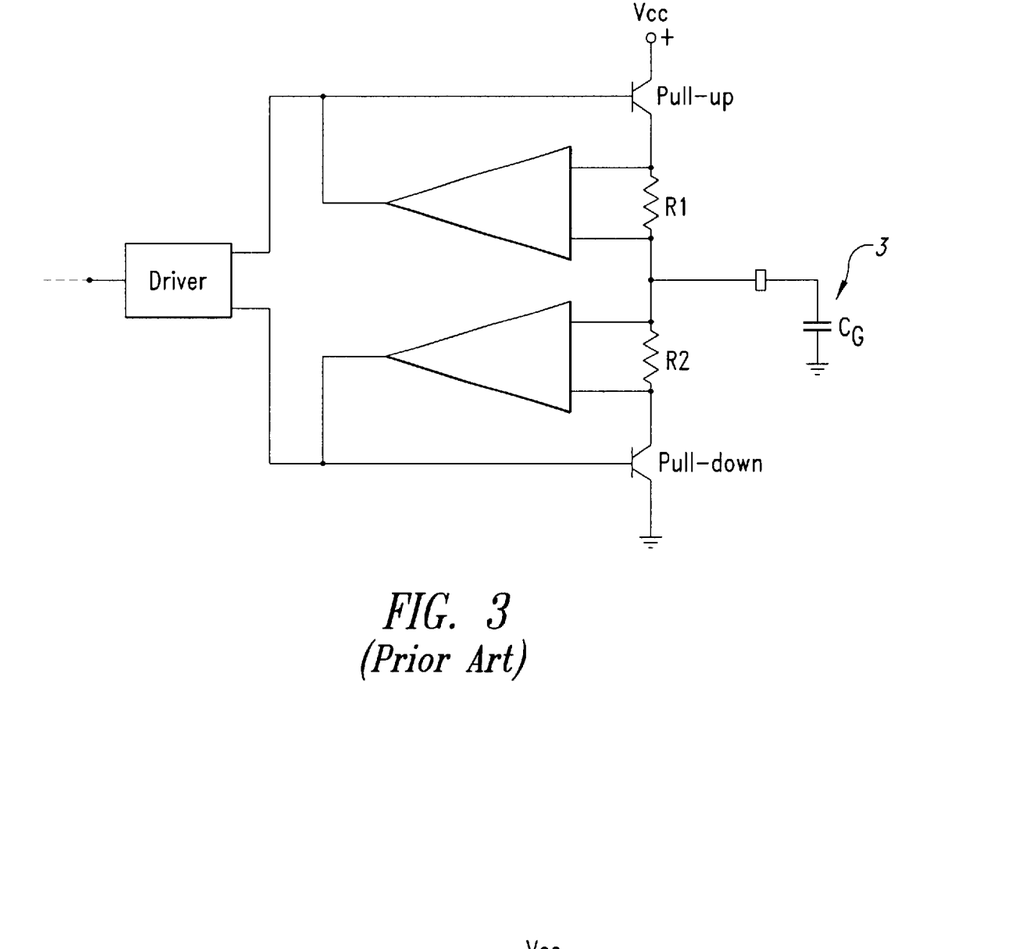
FIG. 3 shows schematically an output stage made with bipolar technology, according to the prior art.

Shown schematically in FIG. 3 is an example of a bipolar type of final stage along with its protective circuit portion. The protector comprises a pair of sensing resistors R1, R2 which are connected at a connection terminal to the power transistor, represented by its inherent capacitance Cg 3.

Each resistor connects the input terminals of a respective amplifier, itself connected between the collector and the base of each bipolar transistor in the output stage.

In this circuit arrangement, as the current in the capacitive load Cg exceeds a predetermined value, the protector is operated to limit the value of the current. Anyhow, the final stage is sized for the largest shorting current therethrough, since the protector is there to limit the current maximum.

This approach has certain drawbacks, as specified herein below:

a protector is incorporated to the final stage;

the final stage is sized to accept the shorting current;

the resistors R1, R2 lower the value of the driving time constant for the control terminal of the power transistor; and with static output loads, the dynamic range of the circuit is adversely affected by the sensing resistors provided.

Figure 4:
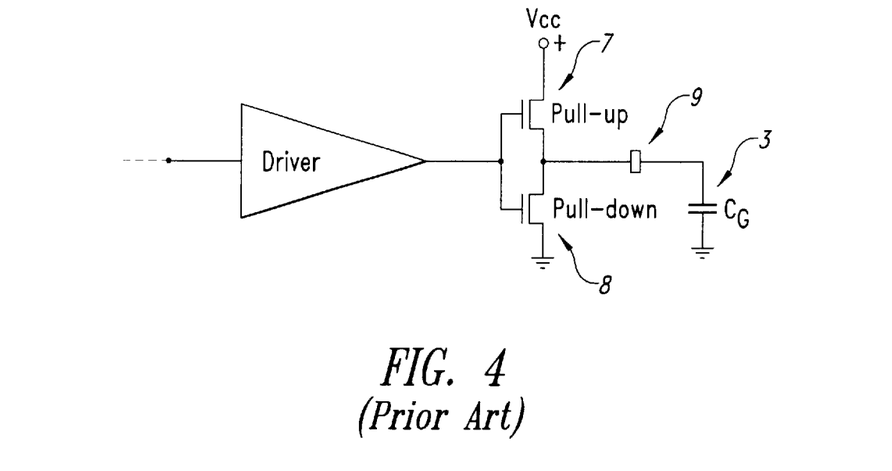
FIG. 4 shows schematically an output stage made with MOS technology, according to the prior art.

Shown schematically in FIG. 4 is an embodiment of a MOS transistor final stage that includes a pull-up MOS transistor 7 connected between a first voltage reference Vcc and an output terminal 9; and a pull-down MOS transistor 8 connected between the output terminal 9 and a second voltage reference (ground). Both MOS transistors 7,8 are driven by a single driver. The protector is omitted from this stage because the stage transistors can be sized to accept shorting currents.

However, this approach also has drawbacks.

Sizing the final stage adds to designing and manufacturing costs.

Also, the pre-drive stages of the final stage must be sized to suit the capacitive load of the final stage, as well as the operation timing.

SUMMARY OF THE INVENTION

An embodiment of this invention provides a novel output stage, for a comparator of an integrated driver circuit, with such structural and functional features that the final stage can be operated at a faster rate and the area requirements of the stage be minimized, thereby overcoming the aforementioned drawbacks of the prior art.

Another embodiment of the invention provides a driving method which can be applied to final stages of any description, i.e., stages including bipolar, MOS or combined components.

The final stage has such structural and functional features that it requires less circuit area for a given speed of operation than prior solutions.

A concept behind this invention is one of having the static control of the comparator final stage separated from its dynamic control.

More particularly, an embodiment of the invention provides for dual (static and dynamic) drive where the final stage is of the bipolar type. With a MOS type of final stage, on the other hand, the capacitive load is driven either statically or dynamically.

With combined technology circuits, e.g., constructed of a bipolar component and a MOS component, each component is driven independently according to whether it is in a static or a dynamic load condition.

Essentially, the final stage supplies large amounts of current at changeovers.

The features and advantages of the output stage and driving method of this invention will be apparent from the following description of embodiments thereof, given by way of non-limitative examples with reference to the accompanying drawings.

DETAILED DESCRIPTION OF THE INVENTION

Figure 5:
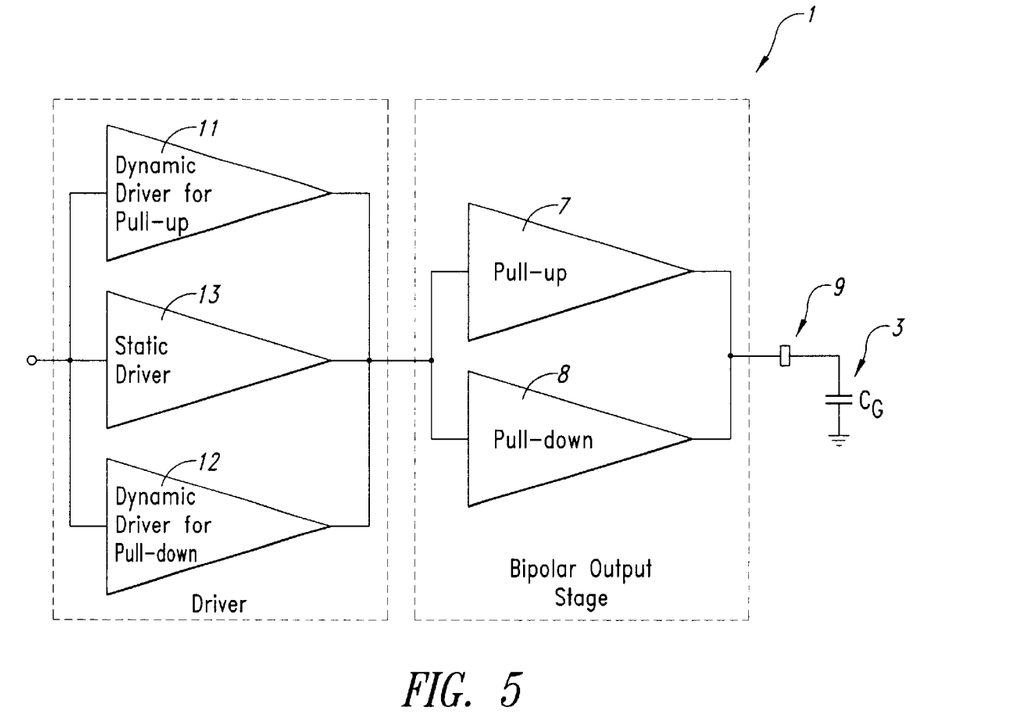
FIG. 5 shows schematically an output stage according to an embodiment of this invention.

Referring to the drawing views, specifically to FIG. 5, a final stage 1 for a comparator incorporated in an electronic circuit 2 is shown in schematic form.

The electronic circuit 2 may be a driver circuit for an external electric load 3, e.g., a capacitive external load. For example, the capacitive load can be an inherent capacitance Cg of a power transistor connected between the electronic driver circuit 2 and an external electric load, not shown because conventional.

As shown in FIG. 1, the electronic circuit 2 includes at least a voltage regulator 5 and a comparator 6. The final stage 1 of this embodiment of the invention is the output stage of the comparator 6. However, the final stage 1 could be used with other types of integrated circuits.

The stage 1 comprises a first or pull-up component 7 and a second or pull-down component 8. The components 7 and 8 are connected, in series with each other, between a first or supply voltage reference Vcc and a second voltage reference which may ground GND, for example.

The respective outputs of the components 7 and 8 are connected to an output terminal 9 of the integrated electronic circuit 2. The terminal 9 is connected, outside the circuit 2, to the control terminal of a power transistor, e.g., a MOS power transistor.

Advantageously, the pull-up component 7 has a driver stage 11 associated therewith which is a dynamic type, and the pull-down component 8 has a corresponding driver stage 12 of a dynamic type associated therewith.

A further driver stage 13 of a static type is shared by both the pull-up and the pull-down component of the final stage 1.

The final stage 1 is to supply large currents at changeovers only, no large currents being required in the static condition, e.g., when a short-circuit occurs.

FIG. 5 shows a comparator 6 having an output stage 1 which comprises bipolar components. This stage is driven by the static driver 13 and two dynamic drivers 11 and 12, one for the pull-up component and the other for the pull-down component.

Figure 6:
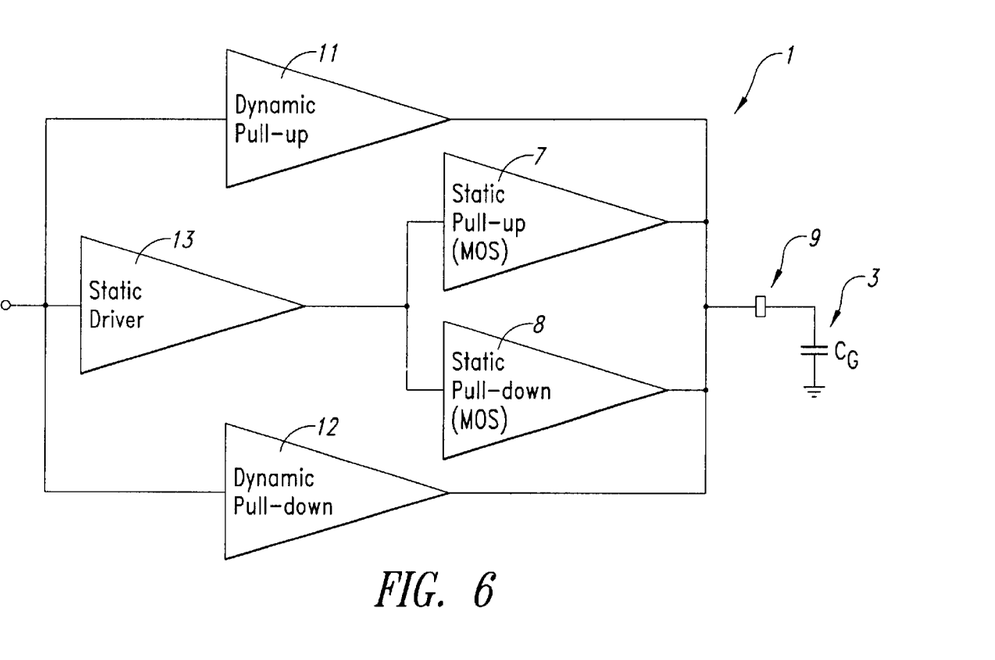
FIG. 6 shows schematically a modified embodiment of the output stage according to the invention.

Shown in FIG. 6 is a second embodiment of the comparator 6, whose output stage 1 comprises MOS components 7, 8. In this modification, the capacitive load Cg is driven directly from a static pull-up component 7 and a dynamic pull-up component 11. A static pull-down component 8 and a dynamic pull-down component 12 are also provided. In addition, a static driver 13 is provided which has its output connected to the final stage.

Essentially, for a final stage comprising MOS transistors, the dynamic drivers are connected to drive the capacitive load Cg directly.

Figure 7:
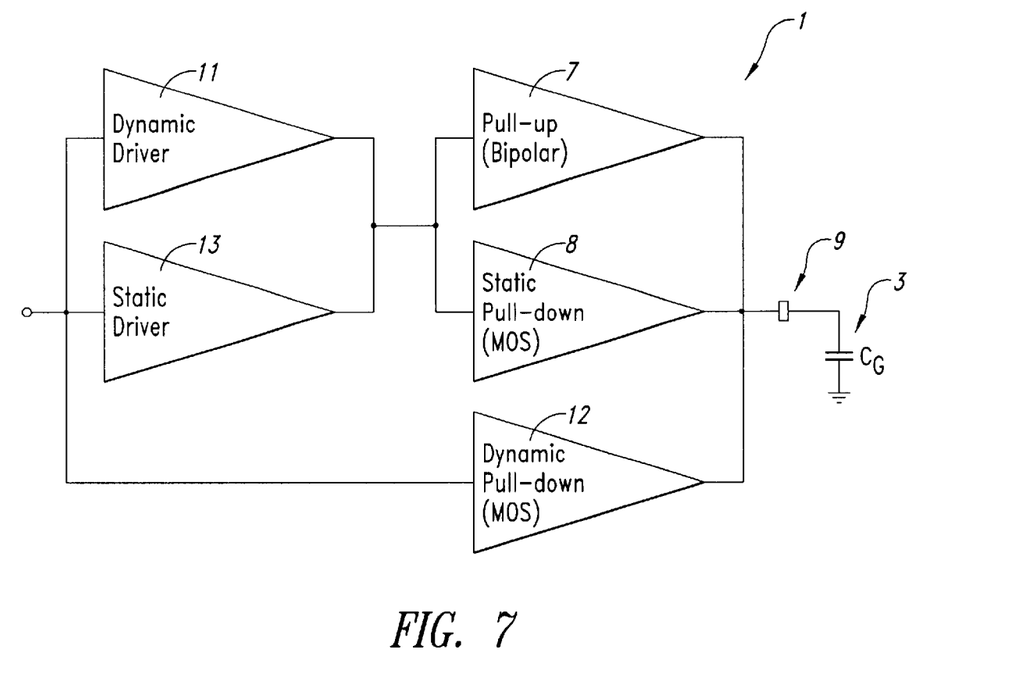
FIG. 7 shows schematically another modified embodiment of the output stage according to the invention.

FIG. 7 shows another modification of the comparator 6, having an output stage made with combined BiCMOS technology, wherein the pull-up component 7 is a bipolar type and provided with static drive and dynamic drive. The pull-down component 8, on the other hand, is a MOS type and comprises a static portion and a dynamic portion.

The term "static drive" is used here to indicate that, after the comparator 6 has changed of state, the drive is held in a standby state until the next comparator changeover. The principle is the same whether the final stage, e.g., a bipolar output stage, is to be driven or the capacitive load Cg driven directly, as in the case of a MOS output stage.

The term "dynamic drive" is used here to indicate that a drive action is applied for a time duration T, only at the leading or the trailing edge of the comparator changeover.

The principle is the same whether the final stage, e.g., a bipolar output stage, is to be driven or the capacitive load Cg driven directly, as in the case of the MOS output stage.

In this way, the capacitive load Cg can be driven upon the comparator 6 changing over by the static as well as the dynamic contribution. The combined action of both contributions determines the speed at which the comparator final stage can change the state of the capacitive load Cg. The dynamic type of action would be nil at steady state; accordingly, in the event of the output becoming shorted at steady state, the bipolar final stage would be driven only by a static component of limited value, and the short-circuit current is limited inherently.

The MOS final stage only operates on the static portion and is sized to accept the short-circuit.

Since this is a capacitive load, in the static condition of the comparator 6 the latter can only develop minor leakage, due to either the capacitor or small resistive loads, toward the respective voltage references. As a result, the final stage section of the comparator can be made quite small, and the lower limit is set by the largest acceptable static load.

Thus, a small final stage with bipolar components is driven statically to produce a limited short-circuit current (this providing self-protection, in a way), which current is coincident with the maximum drivable static load. Therefore, a fairly small (as concerns area occupation) stage can be used, e.g., a self-limited DC bipolar output stage, that is one protected against shorting of the output, and this with a much larger output current at changeovers. It is indeed at changeovers that a larger current is demanded, and by reducing the time that a bipolar transistor is operational, its maximum admissible current can be increased.

This solution is, therefore, far more advantageous than a final stage with a purely statically driven bipolar, which would have to be oversize and provided with specific protection against shorting.

In the instance of a MOS final stage, as shown in FIG. 6, the dynamic portion should have small inherent resistance $R_{DSon}$, to speed up the system, and may be the least size permitted by the technology. By contrast, the static portion is allowed a higher inherent resistance RDSon and may be sized to accept statically a moderate current.

The advantageous aspect is that—instead of using a single MOS transistor, driven statically and of a large size, in order to accept statically a short-circuit current due to substantial inherent resistance $R_{DSon}$, as provided by the prior art—the inherent resistance $R_{DSon}$ is obtained from the combination of a pull-up and a pull-down MOS transistor, of which the larger (by dynamic component) is provided with minimal channel length to save on circuit area.

Figure 8:
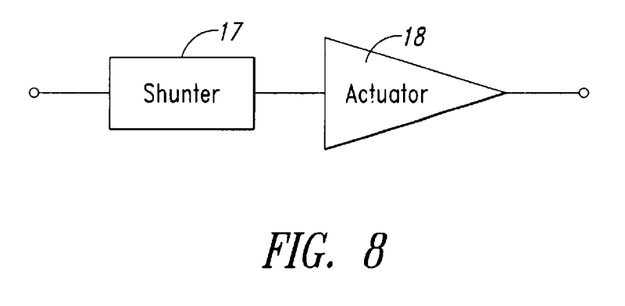
FIG. 8 shows schematically a dynamic driver for use in the output stages of FIGS. 5–7.
Figure 9:
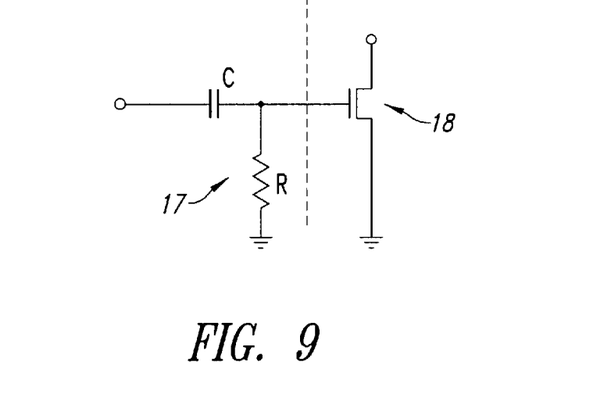
FIG. 9 shows an embodiment of the dynamic driver of FIG. 8.

FIG. 8 shows, in block diagram form, an embodiment of a dynamic driver 11, 12. FIG. 9 shows a possible circuit diagram for the driver.

The driver, 11 or 12, is adapted to drive a following stage only upon a changeover or transition of the comparator 6 and through a predetermined time period To. In a possible embodiment, the changeover edge is converted to a pulse by a shunter 17 connected upstream of an actuator 18 which can be connected to either drive the final stage 1 or drive the capacitive load directly, consistently with the situations illustrated by FIGS. 5, 6 and 7.

The shunter 17 may be a simple RC cell or other timing element that converts a transition to a pulse, and the actuator 18 may either be a MOS or a bipolar transistor. Assume that the state of the capacitive load Cg is to be changed within a time not exceeding 100 ns; then To $\leq$100 nS, and since:

$$To = f(\tau, V_{TH}) \quad (3)$$

where $V_{TH}$ is the operational threshold of the actuator 18, and $\tau$ is the time constant of the shunter 17, to arrive at a rough estimate of the shunting cell, it can be taken:

$$\tau \cong C^*R \leq 100 \; nS. \quad (4)$$

Thus, where in practice C is 5 pF, R would be 20 k $\Omega$.

The low space requirements of the shunting cell—the smaller the cell, the faster the system—are brought forth by the foregoing. In addition, the actuator is a MOS or a bipolar transistor with minimal area requirements.

Shown in FIGS. 10 to 13 are detailed circuit diagrams of possible embodiments of this invention.

Figure 10:
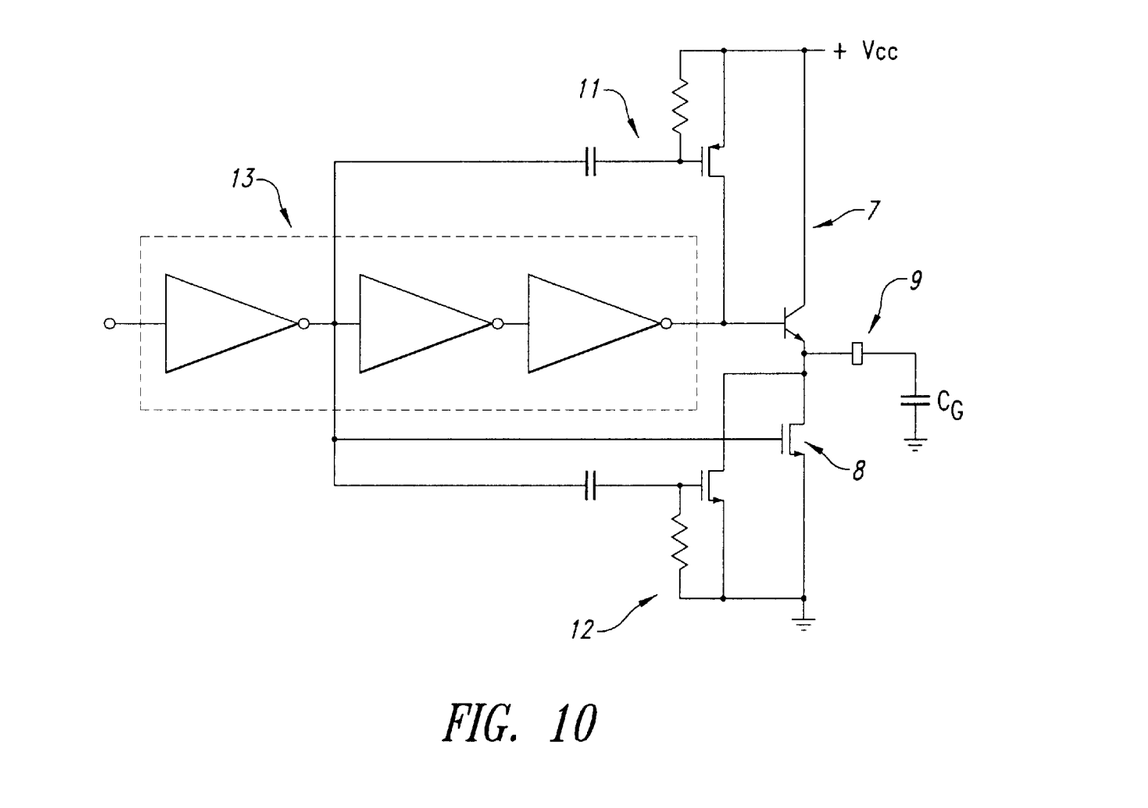
FIGS. 10 to 13 show schematically respective embodiments of the final stage according to this invention.

FIG. 10 shows, for instance, a final stage having an NPN bipolar pull-up component 7 and an N-channel MOS type of pull-down component 8. This is one possible implementation of the final stage shown schematically in FIG. 7.

Figure 11:
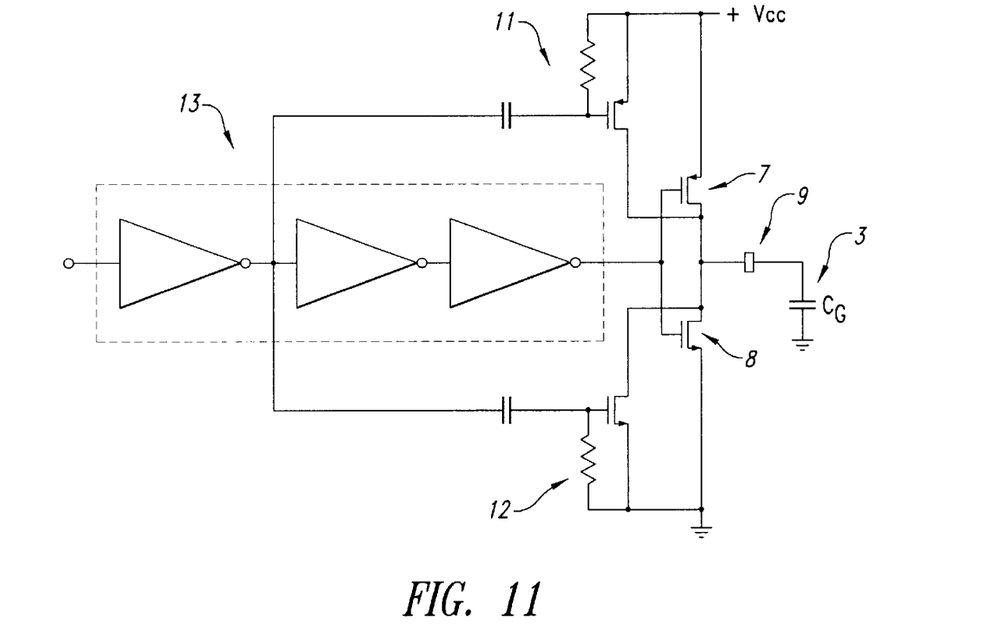
Figure 12:
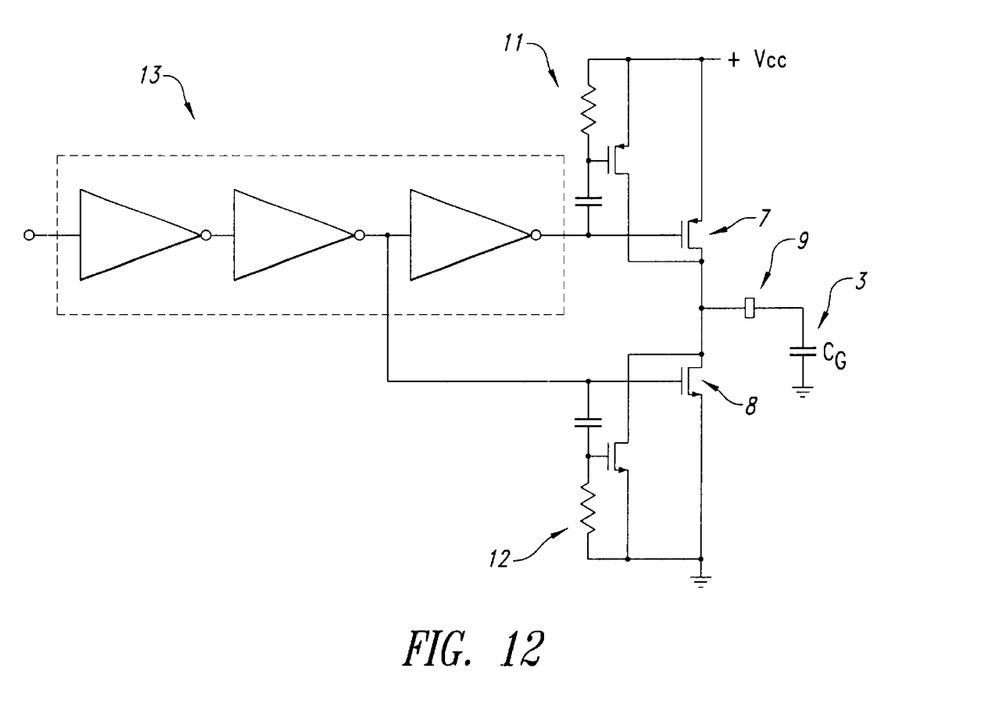
Figure 13:
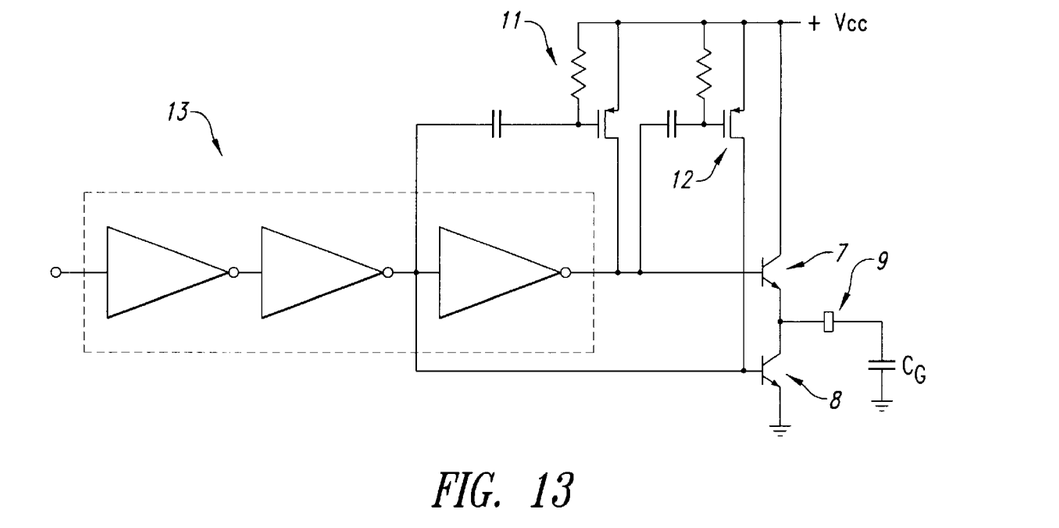

FIG. 11 shows a final stage with a P-channel MOS pull-up transistor and an N-channel MOS pull-down transistor. FIG. 12 shows a final stage with N-channel MOS pull-up and N-channel MOS pull-down. FIGS. 11 and 12 are alternate implementations of the final stage shown schematically in FIG. 6. FIG. 13 shows an NPN bipolar type of final stage with NPN pull-up and NPN pull-down, which is one implementation of the final stage of FIG. 5.

Assume, for example, that the pull-up portion of the final stage is NPN bipolar driven by a MOS dynamic actuator and a static actuator, also of the MOS type, and assume the comparator changeover to involve an action of charging the capacitive load Cg; these being the conditions, the performance of the comparator 6 can be analyzed from both the dynamic and the static viewpoints.

Figure 14:
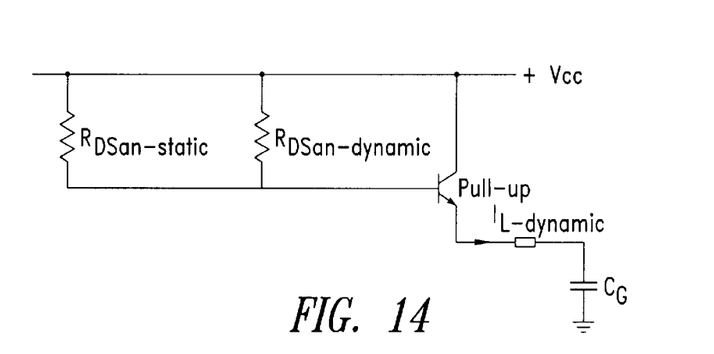
FIGS. 14 and 15 show schematically respective equivalent circuits of the final stage of FIGS. 10–13, in dynamic and static conditions.
Figure 15:
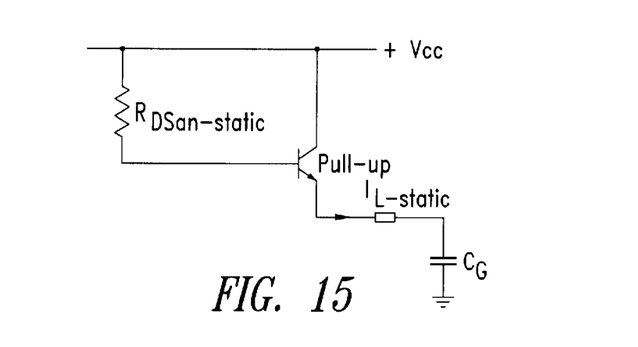

FIGS. 14 and 15 may help to clarify both situations. Dynamically, the load current is given by:

$$I_{L\_din} = \beta^*(Vcc - V_{BE})/(R_{DSon\_stat} // R_{DSon\_din}). \quad (5)$$

Statically, dynamic drive being nil, the resistance $R_{DSon\text{-}din}$ will tend to infinity, and the load current is given by:

$$I_{L\_stat} = \beta^*(Vcc - V_{BE})/R_{DSon\_stat}. \quad (6)$$

Since dynamic current is obviously larger than static current, i.e.

$$I_{L\_din} > I_{L\_stat} \quad (7)$$

it follows that, for proper dimensioning:

$$I_{Leakage} < I_{L\_stat} < I_{max\text{-}final}. \quad (8)$$

Therefore, $I_{L\_stat}$ should be larger than the maximum static load, and smaller than the maximum current which would result in the final stage 1 of comparator 6 being destroyed. It follows that:

$$I_{L\_stat} + I_{L\_din} > Io.$$

Upon the comparator changing over, a capacitive load driving current is obtained which is sufficiently large for a good changeover speed.

For the same changeover speed, the stage of this invention would occupy a smaller circuit area than prior art constructions.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An output stage for an integrated electronic circuit, specifically for a driver circuit of an electric load having at least one capacitive component, the output stage comprising:

a final stage having a pull-up component and a pull-down component connected between a first voltage reference and a second voltage reference; and dynamic drive devices respectively coupled to each component and a separate static drive device coupled to each component of said final stage, wherein the final stage or electric load are driven with dual drive, or with static or dynamic drive, according to a circuit type of the final stage.

2. An output stage according to claim 1, wherein said static drive device is a single device shared by the pull-up and pull-down components of said final stage.

3. An output stage according to claim 1, wherein both said components of the final stage are a MOS type, and that each dynamic drive device is connected to drive said capacitive electric load directly.

4. An output stage according to claim 1, wherein at least one of said dynamic drive devices is structured to apply a dynamic drive action at any changeover edges of a comparator for a predetermined time duration.

5. An output stage according to claim 1, wherein one of said components of the final stage is a bipolar type coupled to said static and dynamic drive devices, and the other of said components is a MOS type having a further dynamic drive device associated therewith and connected to the capacitive load directly.

6. An output stage according to claim 1, wherein said dynamic drive device comprises a shunter and an actuator that are cascade connected.

7. An output stage according to claim 6, wherein said shunter is an RC circuit.

8. An output stage according to claim 6, wherein said actuator is a transistor.

9. An output stage according to claim 1, wherein both said components of the final stage are a bipolar type, and that the dynamic drive device has an output connected to drive a corresponding one of the bipolar components, while the static drive device has an output connected to each of the bipolar components.

10. A method of driving an electric load having a capacitive component, the method comprising:
providing an electronic driver circuit which includes a final stage comprised of a pull-up component and a pull-down component connected with each other between a first supply voltage reference and a second voltage reference; and
providing a dual, static and dynamic, drive for either said final stage or said capacitive load according to whether the final stage is a bipolar, MOS or combined type.

11. A method according to claim 9, wherein each said component of said final stage is driven separately according to whether it is in a static or a dynamic load condition.

12. An integrated driver circuit for driving an electric load, the driver circuit comprising:
a driver input at which a control signal is received;
a first transistor and a second transistor connected to each other between a first voltage reference and a second voltage reference;
a static driver having an input coupled to the driver input and a first output coupled to a control terminal of the first transistor; and
a first dynamic driver having an input coupled to the driver input and an output coupled to the first transistor, the first dynamic driver being structured to drive the load during a changeover condition in the control signal and for a predetermined time period, wherein the first and second transistors or the electric load are driven with dual drive, or with static or dynamic drive, based on circuit types of the first and second transistors.

13. The driver circuit of claim 12 wherein the first transistor is a bipolar transistor and the output of the first dynamic driver is coupled to the control terminal of the first transistor.

14. The driver circuit of claim 13 wherein the second transistor is a MOS transistor and the driver circuit further comprises a second dynamic driver having an input coupled to the driver input and an output coupled to the load and to a conduction terminal of the second transistor.

15. The driver circuit of claim 13 wherein the second transistor is a bipolar transistor and the driver circuit further comprises a second dynamic driver having an input coupled to the first output of the static driver and an output coupled to a control terminal of the second transistor.

16. The driver circuit of claim 12 wherein the static driver includes a second output coupled to a control terminal of the second transistor.

17. The driver circuit of claim 12 wherein the first and second transistors are both MOS transistors and the output of the first dynamic driver is coupled to a conduction terminal of the first transistor and to the load.

18. The driver circuit of claim 17 wherein the first output of the static driver is directly coupled to a control terminal of the second transistor and to the control terminal of the first transistor.

19. The driver circuit of claim 17, further comprising a second dynamic driver coupled between a second output of the static driver and a conduction terminal of the second transistor.

20. The driver circuit of claim 12 wherein the first dynamic driver includes:
a capacitor having first and second plates;
a resistor having a first end coupled to the second plate of the capacitor and a second end coupled to one of the voltage references; and
a third transistor having a control terminal coupled to the first end of the resistor and the second plate of the capacitor, a first conduction terminal coupled to the second end of the resistor, and a second conduction terminal coupled to the first transistor.

21. The driver circuit of claim 12 wherein each of the transistors is driven separately according to a static or dynamic load condition.

22. The output stage of claim 1 wherein each component of the final stage is driven separately according to a static or dynamic load condition.

* * * * *